United States Patent [19]

Jett, Jr.

[11] 4,152,675
[45] May 1, 1979

[54] CRYSTAL OSCILLATOR WITH ADJUSTABLE DUTY CYCLE

[75] Inventor: William B. Jett, Jr., Mesa, Ariz.

[73] Assignee: Motorola, Inc., Schaumburg, Ill.

[21] Appl. No.: 892,553

[22] Filed: Apr. 3, 1978

[51] Int. Cl.$^2$ ............................................. H03B 5/36
[52] U.S. Cl. ........................... 331/116 R; 331/108 D; 331/158; 331/186
[58] Field of Search ................... 331/116 R, 158, 159, 331/185, 186, 108 D, 108 C, 177 R, 117 R; 332/26, 9 R

[56] References Cited

U.S. PATENT DOCUMENTS

| | | | |
|---|---|---|---|
| 3,586,884 | 6/1971 | Gassmann | 307/265 |
| 3,684,981 | 8/1972 | Kreitz | 331/116 R |
| 3,824,495 | 7/1974 | Gerum | 331/116 R |

FOREIGN PATENT DOCUMENTS 38644  11/1971  Japan ..................... 331/116 R

Primary Examiner—Siegfried H. Grimm
Assistant Examiner—Edward Westin
Attorney, Agent, or Firm—Walter W. Nielsen

[57] ABSTRACT

A crystal oscillator is provided a portion of which is fabricated in monolithic integrated circuit form. The circuit is temperature-compensated and utilizes a single 5 volt DC power supply compatible with NMOS and TTL voltage levels. The duty cycle of the oscillator may be varied between approximately 30 and 70 percent.

13 Claims, 4 Drawing Figures

CRYSTAL OSCILLATOR WITH ADJUSTABLE DUTY CYCLE

BACKGROUND OF THE INVENTION

This invention relates generally to oscillator circuits, and, in particular, to a crystal oscillator in which the duty cycle may be varied.

A wide variety of oscillator circuits is known in the electronic arts. See, for example, *Integrated Electronics: Analog and Digital Circuits and Systems*, J. Millman and C. C. Halkias, McGraw-Hill Book Company, New York, 1972, Chapter 14. One such type of oscillator circuit comprises an active device, such as a bipolar transistor, op amp, or FET, and a voltage-series feedback loop, in which the load impedance $Z_L$ consists of an inductance L in parallel with a series combination of two capacitances $C_1$ and $C_2$. This circuit arrangement is known generally as a Colpitts oscillator. A typical Colpitts configuration is shown at page 492 of the above-cited reference.

It is also well known to employ a piezoelectric crystal in an oscillator circuit to achieve high frequency stability with regard to time and temperature. Various crystal oscillator circuits are described beginning on page 495 of the above-cited reference.

In the field of television circuits and associated equipment for generating video signals suitable for utilization with television circuits, it is sometimes desirable to provide a clock oscillator circuit with means for varying the duty cycle thereof. The duty cycle of an oscillator may be defined as the ratio of the width of the positive-going portion of its output signal with respect to the combined widths of the positive-going and the negative-going portion during one cycle of such signal expressed as a percent.

A known oscillator circuit having an adjustable duty cycle is disclosed in U.S. Pat. No. 3,812,387, assigned to the assignee of the present invention. In the aforementioned U.S. patent, which is directed to a horizontal processing circuit for a television receiver, a sawtooth signal is generated by a horizontal oscillator and is used to control a semiconductor switch to which a reference voltage is applied. The semiconductor switch conducts when the applied sawtooth signal is below the reference voltage level, and the duty cycle of the rectangular-wave signal output may be varied by changing the reference voltage level. While the operation of the aforementioned variable duty cycle oscillator is generally satisfactory for its intended purpose, it is desirable to have a variable duty cycle oscillator which generates a high frequency output signal that is very stable.

SUMMARY OF THE INVENTION

Accordingly, it is an object of the present invention to provide an improved oscillator circuit in which the duty cycle may be varied.

It is also an object of the present invention to provide a highly stable crystal oscillator circuit which may be fabricated in large part in monolithic integrated circuit form, and in which the frequency and duty cycle of the output signal may be determined easily through the proper selection and adjustment of components which are external to the integrated circuit.

It is a further object of the present invention to provide an adjustable duty cycle crystal oscillator circuit having a single 5 volt power supply.

These and other objects are achieved in accordance with a preferred embodiment of the invention by providing a crystal oscillator circuit comprising an amplifier circuit fabricated in integrated circuit form and having input and output terminals, an external crystal feedback network connected between the input and output terminals of the amplifier for generating a rectangular-wave output signal at the output terminal of the amplifier, an internal voltage biasing network for determining the DC operating level of the amplifier, and external potentiometer means for varying the DC voltage applied to the voltage biasing network and thereby varying the duty cycle of the oscillator circuit.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE INVENTION

Figure 1:
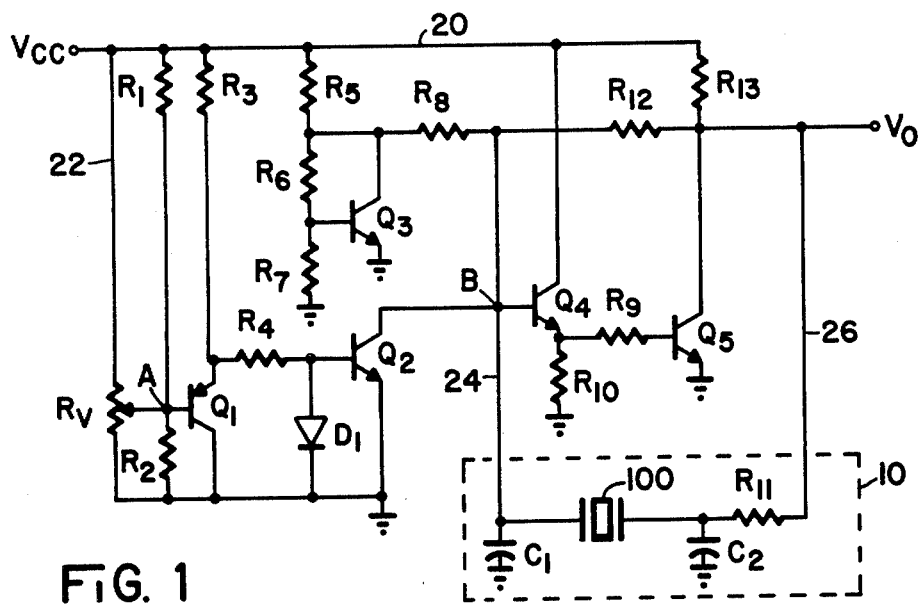
FIG. 1 shows a detailed circuit schematic illustrating a preferred embodiment of the variable duty cycle crystal oscillator circuit of the present invention.

With reference now to FIG. 1, a detailed circuit schematic of the variable duty cycle crystal oscillator circuit of the present invention is shown. Transistor $Q_5$ is an inverting amplifier whose collector is connected to output terminal $V_O$. Transistor $Q_4$ is an emitter follower, whose emitter is connected via resistor $R_9$ to the base of transistor $Q_5$.

Reference numeral 10 indicates generally an external RC and crystal network, comprising capacitances $C_1$ and $C_2$, resistance $R_{11}$, and crystal 100. Output signal $V_O$ is fed back to the base of transistor $Q_4$ by the external RC and crystal network 10, which provides a 180° phase shift at the resonant frequency M of the crystal 100. Crystal 100 has a resonant frequency of 3.579545 megahertz and an internal capacitance of approximately 15 pfd in a preferred embodiment of the invention.

Transistors $Q_1$ and $Q_2$, diode $D_1$, and associated resistors $R_1$–$R_4$ form a voltage biasing network which determines the DC operating level of the oscillator circuit.

Transistor $Q_3$, together with resistors $R_5$–$R_8$, form a voltage reference circuit providing a reference voltage $4\phi$ at the collector of transistor $Q_3$ equal to four times the base-to-emitter voltage $V_{BE}$ of the NPN transistors used in the oscillator circuit. Assuming that transistors $Q_4$ and $Q_5$ are identical, $4\phi$ represents twice the sum of the combined base-to-emitter voltage drops across transistors $Q_4$ and $Q_5$.

Potentiometer $R_V$ is connected between the supply voltage $V_{CC}$ and ground potential, and its tap is connected to the base of transistor $Q_1$. Potentiometer $R_V$ is used to vary the duty cycle of the crystal oscillator circuit by varying the DC potential $V_A$ applied to the DC voltage biasing circuit, in a manner which will be described below.

A preferred embodiment of the variable duty cycle crystal oscillator circuit shown in FIG. 1 was implemented in the form of a monolithic integrated circuit with potentiometer $R_V$ and the crystal feedback network 10 located off-chip and connected to the integrated circuit portion of the circuit through appropriate pin connections.

The actual values of the circuit components used in a preferred embodiment of the invention are as follows:

| | |
|---|---|
| $R_V$ = 5K variable | $R_7$ = 3.6K |
| $R_1$ = 25K | $R_8$ = 20K |
| $R_2$ = 25K | $R_9$ = 300 |
| $R_3$ = 2.5K | $R_{10}$ = 1.3K |
| $R_4$ = 20K | $R_{11}$ = 5.6K |
| $R_5$ = 4.7K | $R_{12}$ = 25K |
| $R_6$ = 11K | $R_{13}$ = 600 |
| $C_1$ = 10–35 pfd. | |
| $C_2$ = 50 pfd. | |
| $V_{CC}$ = 4.75–5.25 volts DC | |

In a preferred embodiment of the invention, the crystal oscillator circuit disclosed herein is used to generate the standard color subcarrier frequency of approximately 3.58 megahertz for use in television circuits.

The theory of operation of the variable duty cycle crystal oscillator circuit will now be explained. First, consider the operation of the amplifier circuit without the crystal feedback network 10 and neglecting base currents in the transistors. Point B serves as a summing point for the currents associated with the $4\phi$ bias, the output voltage $V_O$, and the collector current of transistor $Q_2$. The voltage reference circuit comprising transistor $Q_3$ and resistors $R_5$–$R_8$ provides a DC bias voltage $4\phi$ at the collector of $Q_3$. The voltage at point B is approximately $2\phi$, taking into account the base-to-emitter drops across transistors $Q_4$ and $Q_5$. The current flowing into point B across resistor $R_8$ is represented by the equation $$I_{R8} = 4\phi - 2\phi/R_8 \tag{1}$$

The current flowing into point B across resistor $R_{12}$ may be represented by the equation $$I_{R12} = V_O - 2\phi/R_{12} \tag{2}$$

Thus the steady state current equation at point B may be expressed as $$\frac{4\phi - 2\phi}{R_8} + \frac{V_O - 2\phi}{R_{12}} - I_{Q2} = 0 \tag{3}$$

Assuming resistors $R_8$ and $R_{12}$ are approximately equal, equation (3) reduces to the expression $$I_{Q2} = V_O/R_{12} \tag{4}$$

The collector current of transistor $Q_2$ may be represented by the equation $$I_{Q2} = V_A/R_4 \tag{5}$$

since diode $D_1$ and transistor $Q_2$ form a unity gain turn-around (assuming identical devices are used), and assuming that the base-to-emitter voltages across transistors $Q_1$ and $Q_2$ are approximately the same.

Since resistors $R_4$ and $R_{12}$ are nearly identical, equations (4) and (5) may be combined into $$V_O/R \cong V_A/R \tag{6}$$

replacing $R_{12}$ and $R_4$ by the value R.

From this is derived the equation $$V_O \cong V_A \tag{7}$$

Equation (7) indicates that the DC output voltage $V_O$ of the amplifier circuit is approximately equal to the voltage $V_A$ applied to the base of transistor $Q_1$.

The next step in the circuit analysis is to add the crystal feedback network 10 comprising the crystal 100, capacitances $C_1$ and $C_2$, and resistance $R_{11}$, which form a Colpitts type oscillator with the amplifier circuit. Since the DC conditions expressed by equation (7) must still be met, the average output voltage $\overline{V_O}$ must still approximate voltage $V_A$ as shown by equation (8) below.

$$\overline{V_O} \cong V_A \tag{8}$$

To satisfy equation (8) for varying values of $V_A$, the duty cycle of output waveform $V_O$ must change accordingly, so that the DC component $\overline{V_O}$ of the output voltage continues to approximate the value of $V_A$.

Figure 2A:
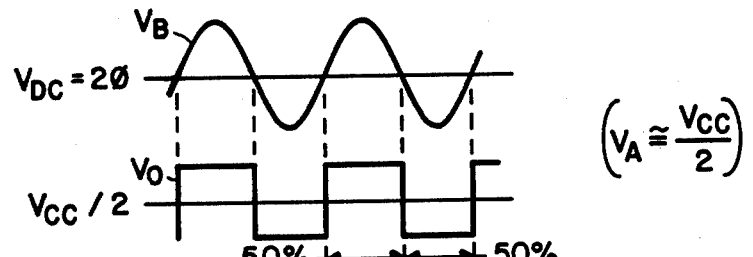
FIG. 2A shows an output waveform of the variable duty cycle crystal oscillator circuit, which waveform represents a duty cycle of approximately 50 percent.

The manner in which the duty cycle of output waveform $V_O$ varies will be explained with regard to FIGS. 2A–2C. FIG. 2A illustrates a duty cycle of 50 percent in output waveform $V_O$, corresponding to the condition when $V_A$ is set at approximately $V_{CC}/2$. The sinusoidal curve $V_B$ in FIG. 2A represents the feedback signal from $V_O$ through crystal network 10 to point B at the base of transistor $Q_4$. With the DC component $V_{DC}$ of signal $V_B$ equal to $2\phi$, transistor $Q_4$ is conductive approximately 50 percent of the time, and output waveform $V_O$ is accordingly on approximately 50 percent of the time. As shown in the lower portion of FIG. 2A, the average value $\overline{V_O}$ of the rectangular-wave output signal $V_O$ is approximately equal to $V_{CC}/2$. Since $V_A$ was set equal to $V_{CC}/2$, it is shown that equation (8) has been satisfied.

Figure 2B:
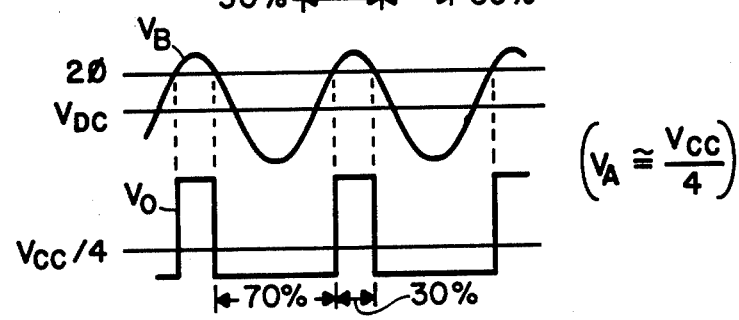
FIG. 2B shows an output waveform of the variable duty cycle crystal oscillator circuit, which waveform represents a duty cycle of approximately 30 percent.

Referring now to FIG. 2B, the waveforms illustrated correspond to the condition when $V_A$ is set to approximately $V_{CC}/4$. For this condition the DC component $V_{DC}$ of waveform $V_B$ is somewhat less than the $2\phi$ value required to turn on transistor $Q_4$. Accordingly, as seen in the lower portion of FIG. 2B output waveform $V_O$ is turned on approximately 30 percent of the time, and the average value $\overline{V_O}$ of output waveform $V_O$ is approximately equal to the quantity $V_{CC}/4$.

Figure 2C:
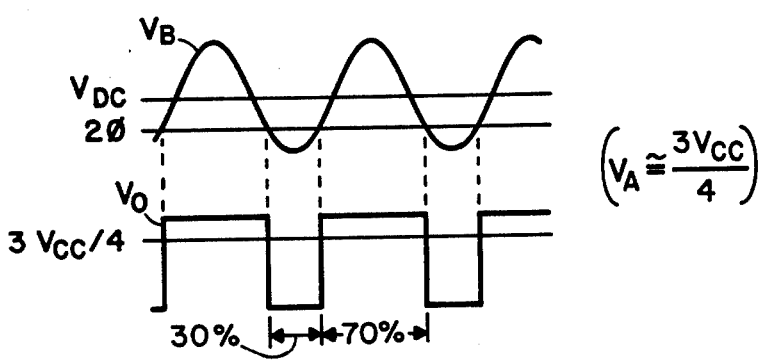
FIG. 2C shows an output waveform of the variable duty cycle crystal oscillator circuit, which waveform represents a duty cycle of approximately 70 percent.

Similarly, as seen in FIG. 2C, when $V_A$ is set to approximately $3V_{CC}/4$, the DC component $V_{DC}$ of waveform $V_B$ exceeds the value $2\phi$ necessary to turn on transistor $Q_4$ for a relatively greater proportion of the time, and output waveform $V_O$ remains on for approximately 70 percent of each cycle. From the lower portion of FIG. 2C, it is seen that the average value $\overline{V_O}$ of output waveform $V_O$ is approximately $3V_{CC}/4$.

It will be understood that the duty cycle of output waveform $V_O$ of the crystal oscillator circuit may be adjusted to any value between approximately 30 percent and 70 percent merely by varying potentiometer $R_V$. In the event that a constant duty cycle of 50 percent is desired, potentiometer $R_V$ may be deleted.

It should be noted that at the operating frequency of approximately 3.58 megahertz in the preferred embodiment, the storage time of transistor $Q_5$ becomes significant; however it does not significantly affect the DC equivalency expressed by equation (8). Also, it should be noted that since the DC voltage component $V_{DC}$ at the base of transistor $Q_4$ is variable depending upon the setting of $V_A$, the DC component $\overline{V_O}$ of the output waveform $V_O$ only approximates $V_A$, and the deviation of $\overline{V_O}$ from $V_A$ is dependent upon the amplitude of the oscillatory signal $V_B$ at the base of transistor $Q_4$.

The adjustable duty cycle crystal oscillator circuit herein described has the advantage of excellent stability. The thermal stability is such that over the operating range of 0°–70° C. the duty cycle of the output varies a maximum of ±5 percent, assuming a 3.58 megahertz crystal is used.

In addition, the single power supply voltage of 5V is compatible with both MOS and TTL circuits. A further advantage of the oscillator circuit is low power consumption.

It will be apparent to those skilled in the art that the disclosed Crystal Oscillator With Adjustable Duty Cycle may be modified in numerous ways and may assume many embodiments other than the preferred form specifically set out and described above. Accordingly, it is intended by the appended claims to cover all modifications of the invention which fall within the true spirit and scope of the invention.

What is claimed is:

1. An oscillator circuit having a variable duty cycle, said oscillator circuit comprising:
   a PNP transistor having its emitter coupled to a first potential and its collector coupled to a second potential;
   a first NPN transistor having its base coupled to the emitter of said PNP transistor and its emitter coupled to said second potential;
   a diode having its anode coupled to the base of said first NPN transistor and its cathode coupled to said second potential;
   a second NPN transistor having its base coupled to the collector of said first NPN transistor and to a third potential, its collector coupled to said first potential, and its emitter coupled to said second potential;
   a third NPN transistor having its base coupled to the emitter of said second NPN transistor, its collector coupled to said first potential and to an output terminal at which an output signal is generated, and its emitter coupled to said second potential;
   a piezoelectric crystal having a first terminal coupled to the base of said second NPN transistor and a second terminal coupled to said output terminal;
   first and second capacitance means coupled between said first and second terminals, respectively, of said crystal and said second potential; and
   means connected between the base of said PNP transistor and said first potential for varying the potential applied to said base, whereby the duty cycle of said output signal may be varied.

2. The oscillator circuit recited in claim 1, wherein the magnitude of said third potential is approximately equal to twice the sum of the base-to-emitter potential drops across said second and third NPN transistors.

3. The oscillator circuit recited in claim 1, wherein the duty cycle of said output signal may be varied between 30% and 70%.

4. The oscillator circuit recited in claim 1, wherein said transistors and said diode form part of a monolithic integrated circuit and said crystal and said means for varying said potential are external to said monolithic integrated circuit.

5. The oscillator circuit recited in claim 1, and further comprising a single power supply of approximately 5 volts DC.

6. The oscillator circuit recited in claim 1, wherein said means for varying said potential comprises a potentiometer.

7. An oscillator circuit having a variable duty cycle, said oscillator circuit comprising:
   (a) a biasing circuit including
       a first transistor having its emitter coupled to a first potential and to a junction and its collector coupled to a second potential, and
       means connected between the base of said first transistor and said first potential for varying the potential $V_A$ at the base of said first transistor;
   (b) an amplifier circuit including
       a second transistor having its collector coupled to said first potential and an output terminal of said oscillator circuit and having its emitter coupled to said second potential, and
       a third transistor having its collector coupled to said first potential, its emitter coupled to said second potential and to the base of said second transistor, and its base coupled to said junction, said third transistor being rendered conductive when a potential $2\phi$ is applied to its base;
   (c) a crystal feedback circuit including
       a piezoelectric crystal having a first terminal coupled to the base of said third transistor and a second terminal coupled to said output terminal, and
       first and second capacitance means coupled between said first and second terminals, respectively, of said crystal and said second potential; and
   (d) a reference circuit including
       resistive means having a first terminal and a second terminal, said second terminal being coupled to said junction, and
       means for providing a reference potential at the first terminal of said resistive means, said reference potential being greater than $2\phi$;
   wherein an oscillating signal having a substantially constant period is generated at said output terminal, said oscillating signal having a DC voltage component $\overline{V_o}$ substantially equal to said potential $V_A$, wherein $\overline{V_o}$ exceeds said potential $2\phi$ at the base of said third transistor for a relatively greater proportion of said output signal period as $V_A$ is increased, and wherein $\overline{V_o}$ exceeds said potential $2\phi$ for a relatively lesser proportion of said output signal period as $V_A$ is decreased.

8. The oscillator circuit recited in claim 7, wherein said first transistor is a PNP transistor and said second and third transistors are NPN transistors.

9. The oscillator circuit recited in claim 7, wherein the duty cycle of said output signal may be varied between 30% and 70%.

10. The oscillator circuit recited in claim 7, wherein said amplifier circuit and said reference circuit form part of a monolithic integrated circuit and said crystal feedback circuit and said means for varying said potential $V_A$ are external to said monolithic integrated circuit.

11. The oscillator circuit recited in claim 7, wherein the base-to-emitter potential drop across each of said second and third transistors is equal to $\phi$.

12. The oscillator circuit recited in claim 7, wherein said first potential is approximately 5 volts DC with respect to said second potential.

13. The oscillator circuit recited in claim 7, wherein said means for varying said potential $V_A$ comprises a potentiometer.

* * * * *